United States Patent [19]

Nishimura

[11] Patent Number: 4,949,138
[45] Date of Patent: Aug. 14, 1990

[54] SEMICONDUCTOR INTEGRATED CIRCUIT DEVICE

[75] Inventor: Akitoshi Nishimura, Ibaraki, Japan

[73] Assignee: Texas Instruments Incorporated, Dallas, Tex.

[21] Appl. No.: 351,265

[22] Filed: May 11, 1989

Related U.S. Application Data

[63] Continuation of Ser. No. 113,794, Oct. 27, 1987, abandoned.

[51] Int. Cl.$^5$ .................... H01L 29/78; H01L 27/02; H01L 29/06
[52] U.S. Cl. .................... 357/23.6; 357/41; 357/55
[58] Field of Search ........................ 357/23.6, 41, 55

[56] References Cited

U.S. PATENT DOCUMENTS 4,630,088  12/1986  Ogura et al. .................... 357/23.6

Primary Examiner—Rolf Hille
Assistant Examiner—Robert P. Limanek
Attorney, Agent, or Firm—William E. Hiller; N. Rhys Merrett; Melvin Sharp

[57] ABSTRACT

A semiconductor IC device comprising a memory cell wherein a word line is buried in a groove formed in a semiconductor layer, a transfer gate transistor is constructed by the word line and a side area thereof, and on the surface of the semiconductor layer there is formed a capacitor having one electrode being a source or drain region of the transfer gate transistor and a dielectric film contacting with the electrode.

8 Claims, 1 Drawing Sheet

SEMICONDUCTOR INTEGRATED CIRCUIT DEVICE

This application is a continuation, of application Ser. No. 113,794, filed 10/27/87, now abandoned.

BACKGROUND OF THE INVENTION

1. Field of the Invention

The present invention relates to a semiconductor integrated circuit (IC) device, particularly to a dynamic random access memory (RAM) having a memory cell with one transistor and one capacitor.

2. Description of the Prior Art

In a dynamic RAM of the prior art as shown in FIG. 1, a gate electrode of a transfer gate transistor Tr' is electrically connected with a word line and a capacitor C' is formed between a drain of the transistor Tr' and a power source Vcc.

On the other hand, FIG. 2 shows a known memory cell wherein the capacitor C' is disposed between a bit line and a source of the transistor Tr' different from that of FIG. 1. Also the memory cell of FIG. 2 can function as a dynamic RAM.

FIG. 3 shows an example of a memory cell for a dynamic RAM according to the circuit of FIG. 2. In the memory cell, one of N+-type diffusion areas 1 and 2, that is, a source region 2 of a transistor Tr' formed in a P-type epitaxial layer 6 is led out on a LOCOS (Local Oxidation of Silicon) oxide film 4 through a polysilicon wire or layer 3. At the led-out area of the source region, there is provided a capacitor C' having a thin oxide film 5 as a dielectric film and a polysilicon bit line B overlayed on the layer 3 as an electrode.

The memory cell of FIG. 3 is called "stacked cell" having the capacitor C' formed between the polysilicon layers 3 and B. However, there are several problems, for example, insulator breakdown of the capacitor may result due to the thin oxide film 5, and the process of manufacturing the cell is complicated.

OBJECTS AND SUMMARY OF THE INVENTION

An object of the present invention is to provide a semiconductor IC device comprising a memory cell easily manufactured with a capacitor of uniform film characteristic and high reliability.

Namely, the present invention provides a semiconductor IC device comprising a memory cell wherein a word line is buried in a groove formed in a semiconductor layer, a transfer gate transistor is constructed by the word line and a side area thereof, and on the surface of the semiconductor layer there is formed a capacitor having one electrode being a source or drain region of the transfer gate transistor and a dielectric film contacting with the electrode.

Other objects, features and advantages of the invention will appear more fully from the following detailed description thereof taken in connection with the accompanying drawings.

DESCRIPTION OF THE PREFERRED EMBODIMENTS

Figure 4:
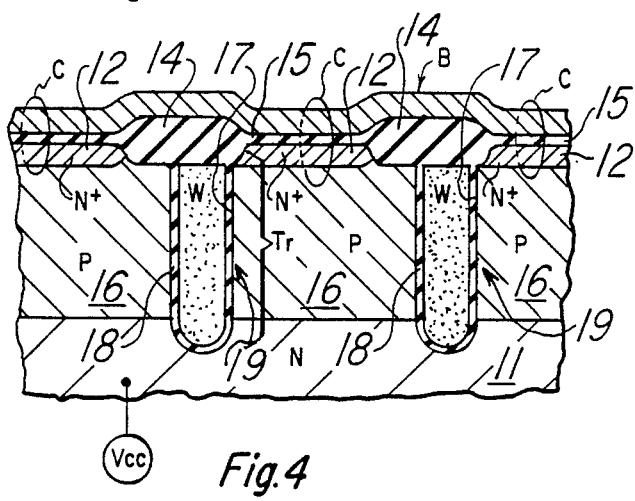
FIG. 4 is a cross-sectional view of a memory cell portion embodying a dynamic RAM of the present invention.
Figure 5:
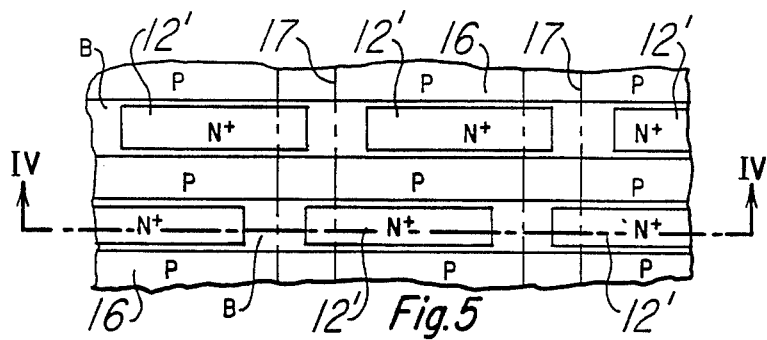
FIG. 5 is a plan view of the memory cell portion of the dynamic RAM as shown in FIG. 4 (the view of FIG. 4 being taken along the line IV—IV of FIG. 5).

FIGS. 4 and 5 show a memory cell of a dynamic RAM according to one embodiment of the present invention.

In the memory cell, straight grooves 17 are formed in a P-type epitaxial layer 16 on a N-type semiconductor substrate 11, penetrating through the epitaxial layer 16 in the thickness direction. Each word line W of polysilicon is buried in the groove 17 with a thin gate oxide film 18 formed therein. A transistor Tr for a vertical-type transfer gate is so constructed that the word line functions as a gate and at the side area thereof N+-type source region 12 and drain region 11 and a channel region 19 are respectively defined. On the surface of the epitaxial layer 16, there is formed a capacitor C wherein the source region 12 of the transistor Tr is one of two opposite electrodes of the capacitor, a bit line B of polysilicon or the like is the other electrode and a thin oxide film (SiO$_2$ film) 15 formed between the two electrodes immediately over the source region 12 functions as a dielectric film. The substrate 11 provides the drain region of the transistor and is set at a power source level Vcc.

Figure 1:
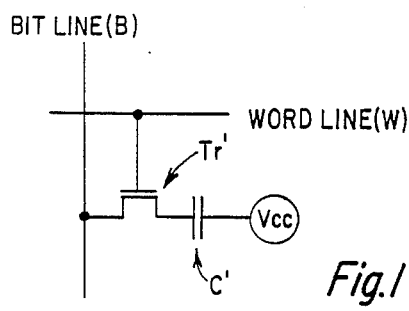
FIG. 1 is an equivalent circuit diagram of a memory cell portion of a dynamic RAM.
Figure 2:
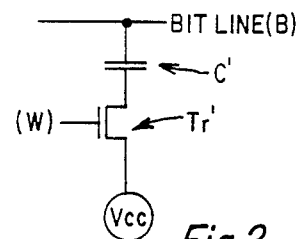
FIG. 2 is an equivalent circuit diagram of a memory cell.
Figure 3:
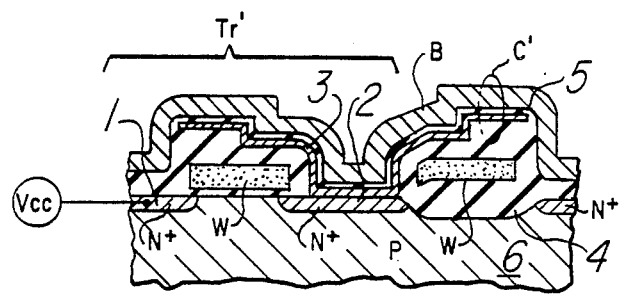
FIG. 3 is a cross-sectional view of a memory cell of a dynamic RAM of the prior art.

The equivalent circuit of the memory cell is equivalently shown in FIG. 2. In FIG. 5, the N+-type diffusion region 12 positioned below the bit line B is configured with a pattern in conformity with a mask pattern 12' which is used for an ion plantation of an N-type impurity. Because the LOCOS oxide film 14 functions also as a mask for the ion implantation, an ion-implanted region has a pattern substantially corresponding to the region 12 of FIG. 4.

According to the memory cell constructed as mentioned above, the oxide film 15 is a uniform and highly reliable dielectric membrane because it can be grown by thermal oxidation of the silicon layer 16. The thermal oxidation can be easily performed as in the known way. Even when another film formed by the known process other than thermal oxidation is used as the dielectric film, the process can be performed with no difficulty.

The memory cell has a word line W buried in the groove 17; however, the word line is more easily formed because of the straight-shaped groove 17 compared with another shape of the groove. The side area of the groove 17 is used for an operative region of the transistor Tr, which enables the size of the memory cell to be considerably reduced in the plan-layout. The process of manufacturing the memory cell can be simplified.

It will be evident that obvious modifications can be made to the described embodiments without departing from the scope of the present invention.

For example, in the above embodiment, the materials of the above respective regions or portions, the method of forming the same and the configuration or pattern etc. can be variously modified. The above-described dielectric film can be made of SiO$_2$, TiO$_x$, WO$_x$, Si$_3$N$_4$ or other high dielectric material. The conductivity of at least a part of the above-described semiconductor regions can be reversed.

According to the embodiment of the present invention, as described above, the word line buried in the groove such that the side area thereof constitutes the transfer gate and the dielectric film is formed in contact with and between the surface of the transfer gate and the source or drain region of the transistor. Therefore, the dielectric film can be formed by thermal oxidation or the like with uniformity and high insulating property and high reliability. And, because the word line as the gate is buried in the groove, it is possible to reduce the cell size and to simplify the process of manufacturing the cell.

What is claimed is:

1. A semiconductor integrated circuit device comprising:
    a semiconductor body having a top surface, said semiconductor body having a plurality of vertically elongated grooves provided therein opening onto the top surface thereof;
    said semiconductor body including a lower semiconductor portion of one conductivity type and an upper semiconductor portion of the other conductivity type;
    said plurality of vertically elongated grooves extending into said lower semiconductor portion of one conductivity type;
    a plurality of regions of said one conductivity type provided in said upper semiconductor portion of the other conductivity type and opening onto the top surface of said semiconductor body, said plurality of regions being arranged in groups defining respective rows of said regions of said one conductivity type;
    an insulation lining disposed in each of said grooves and covering the groove-defining surfaces of said semiconductor body;
    a conductive material filling each of said grooves and being insulated from said semiconductor body by said insulation lining in said grooves;
    an insulation layer disposed on said top surface of said semiconductor body and including spaced apart insulation portions of increased thickness, the remaining portions of said insulation layer being relatively thin in relation to said insulation portions of increased thickness;
    each of said insulation portions of increased thickness extending above the upper surface and below the lower surface of said relatively thin remaining portions of said insulation layer, each of said insulation portions of increased thickness further being interposed between adjacent regions of said one conductivity type provided in said upper semiconductor portion of the other conductivity type to electrically isolate adjacent ones of said regions of said one conductivity type from each other and overlying said conductive material filling each of said grooves;
    said relatively thin remaining portions of said insulation layer overlying said plurality of regions of said one conductivity type provided in said upper semiconductor portion of the other conductivity type and respectively extending between adjacent insulation portions of increased thickness;
    a plurality of strips of conductive material overlying said insulation layer in registration with respective rows of said regions of said one conductivity type;
    said semiconductor body, said conductive material filling each of said grooves in said semiconductor body, said insulation layer and said plurality of strips of conductive material cooperating to define a plurality of memory cells each comprising a transfer gate transistor and a capacitor;
    the transistor of each memory cell being vertically arranged along the conductive material filling a respective groove and including one of said regions of said one conductivity type as a source region, the upper semiconductor portion of said other conductivity type as a channel region, and the lower semiconductor portion of said one conductivity type as a drain region, with said conductive material filling said groove being a transfer gate;
    the capacitor of each memory cell including said one region of said one conductivity type forming the source region of said transistor as a first electrode, a respective one of said plurality of strips of conductive material in registration with the row containing said one region of said one conductivity type as a second electrode, and a respective relatively thin portion of said insulation layer as the dielectric layer between said first and second electrodes; and
    said conductive material filling each of said grooves in said semiconductor body serving as respective word lines and said plurality of strips of conductive material serving as bit lines for the plurality of memory cells.

2. A semiconductor integrated circuit device as set forth in claim 1, wherein said lower semiconductor portion of said semiconductor body is a semiconductor substrate of one conductivity type, and said upper semiconductor portion of said semiconductor body is an epitaxial layer of semiconductor material of the other conductivity type disposed on said semiconductor substrate of one conductivity type and defining the top surface of said semiconductor body;
    said plurality of vertically elongated grooves extending into said semiconductor substrate of one conductivity type and opening onto the top surface of said semiconductor body as provided by said epitaxial semiconductor layer of the other conductivity type.

3. A semiconductor integrated circuit device as set forth in claim 1, wherein each respective relatively thin portion of said insulation layer defining the dielectric layer between said first and second electrodes of the capacitor of each of said plurality of memory cells is of substantially uniform thickness.

4. A semiconductor integrated circuit device as set forth in claim 3, wherein each of the vertically elongated grooves included in said plurality of vertically elongated grooves is defined by substantially vertical side wall surfaces of said semiconductor body.

5. A semiconductor integrated circuit device as set forth in claim 4, wherein the conductive material filling each of said grooves is polysilicon so as to define said word lines as polysilicon conductors.

6. A semiconductor integrated circuit device as set forth in claim 5, wherein said plurality of strips of conductive material are polysilicon so as to define said bit lines as polysilicon conductors.

7. A semiconductor integrated circuit device as set forth in claim 2, wherein said semiconductor substrate of said semiconductor body is silicon material of one conductivity type, said epitaxial semiconductor layer disposed on said silicon substrate is epitaxial silicon of the other conductivity type, said insulation lining and said insulation layer are silicon oxide, and said word lines and said bit lines are polysilicon conductors.

8. A semiconductor integrated circuit device as set forth in claim 1, wherein the corresponding source regions of said vertically arranged transistors included in each memory cell underlying adjacent bit lines are disposed in staggered relation with respect to each other.

* * * * *